US012382581B2

(12) United States Patent
Yao et al.

(10) Patent No.: US 12,382,581 B2
(45) Date of Patent: Aug. 5, 2025

(54) SIDEWALL PLATING OF CIRCUIT BOARDS FOR LAYER TRANSITION CONNECTIONS

(71) Applicant: International Business Machines Corporation, Armonk, NY (US)

(72) Inventors: Yuan Yao, Tarrytown, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 17/741,429

(22) Filed: May 10, 2022

(65) Prior Publication Data

US 2023/0371177 A1 Nov. 16, 2023

(51) Int. Cl.
| | |
|---|---|
| H05K 1/11 | (2006.01) |
| H01F 17/00 | (2006.01) |
| H01F 27/255 | (2006.01) |
| H01F 27/28 | (2006.01) |
| H05K 1/16 | (2006.01) |
| H05K 3/42 | (2006.01) |

(52) U.S. Cl.
CPC ......... *H05K 1/115* (2013.01); *H01F 17/0013* (2013.01); *H01F 27/255* (2013.01); *H01F 27/2804* (2013.01); *H05K 1/165* (2013.01); *H05K 3/429* (2013.01); *H01F 2027/2809* (2013.01); *H05K 2201/086* (2013.01)

(58) Field of Classification Search
None
See application file for complete search history.

(56) References Cited

U.S. PATENT DOCUMENTS

| | | | | | |
|---|---|---|---|---|---|
| 3,004,230 | A | * | 10/1961 | Levinsohn | .............. H01F 30/10 336/107 |
| 3,185,947 | A | * | 5/1965 | Freymodsson | ..... H01F 17/0033 29/829 |

(Continued)

FOREIGN PATENT DOCUMENTS

| | | |
|---|---|---|
| CN | 102158051 | 8/2011 |
| CN | 104219879 | 12/2014 |
| DE | 69729196 | 10/2004 |

OTHER PUBLICATIONS

Taiwan Intellectual Property Office, Search Report. Counterpart Taiwan Application TW11221008580. Oct. 12, 2023. pp. 12 in Traditional Chinese, significance of references in X and A categories on p. 11.

(Continued)

*Primary Examiner* — Timothy J. Dole
*Assistant Examiner* — Muhammed Azam
(74) *Attorney, Agent, or Firm* — Stosch Sabo; Otterstedt & Kammer PLLC (57) ABSTRACT

A circuit board including: a first board material layer having a first planar surface and a first sidewall surface perpendicular to the first planar surface; a first conductive layer on the first planar surface; a second board material layer stacked on the first board material layer and having a second planar surface and a second sidewall surface perpendicular to the second planar surface; a second conductive layer on the second planar surface; and a plating on the first sidewall surface and the second sidewall surface and electrically connecting the first conductive layer and the second conductive layer.

20 Claims, 5 Drawing Sheets

(56) References Cited

U.S. PATENT DOCUMENTS

| | | | | |
|---|---|---|---|---|
| 4,864,486 A * | 9/1989 | Spreen | H01F 27/2871 | 363/141 |
| 4,873,757 A * | 10/1989 | Williams | H01F 17/0013 | 29/852 |
| 5,396,101 A * | 3/1995 | Shiga | H01F 17/0006 | 257/E21.022 |
| 5,487,214 A | 1/1996 | Walters | | |
| 5,572,179 A * | 11/1996 | Ito | H01F 17/0006 | 336/200 |
| 5,863,447 A | 1/1999 | Coteus | | |
| 5,898,991 A * | 5/1999 | Fogel | H01F 41/046 | 29/602.1 |
| 5,945,902 A * | 8/1999 | Lipkes | H01F 41/046 | 336/200 |
| 6,069,548 A | 5/2000 | Baarman et al. | | |
| 6,073,339 A * | 6/2000 | Levin | H01F 41/046 | 336/200 |
| 6,293,001 B1 * | 9/2001 | Uriu | H01F 41/041 | 336/200 |
| 6,426,466 B1 * | 7/2002 | Chamberlin | H05K 1/0263 | 174/255 |
| 6,628,531 B2 * | 9/2003 | Dadafshar | H05K 1/165 | 336/200 |
| 6,847,284 B2 * | 1/2005 | Gamou | H01F 27/2804 | 336/200 |
| 6,914,508 B2 * | 7/2005 | Ferencz | H01F 27/2804 | 336/200 |
| 6,980,074 B1 * | 12/2005 | Jitaru | H05K 1/165 | 336/200 |
| 7,018,548 B2 * | 3/2006 | Kamijima | G03F 7/0035 | 216/75 |
| 7,084,728 B2 * | 8/2006 | Hyvonen | H01L 23/5227 | 336/200 |
| 7,180,397 B1 * | 2/2007 | Busletta | H05K 1/165 | 336/200 |
| 7,248,138 B2 * | 7/2007 | Chiang | H01F 27/2804 | 336/200 |
| 7,262,680 B2 * | 8/2007 | Wang | H01F 17/0013 | 336/200 |
| 7,304,862 B2 | 12/2007 | Busletta | | |
| 7,332,993 B1 * | 2/2008 | Nussbaum | H01F 27/2804 | 336/200 |
| 7,345,563 B2 * | 3/2008 | Pavier | H05K 1/165 | 336/200 |
| 7,427,910 B2 * | 9/2008 | Mehrotra | H01F 27/2804 | 336/200 |
| 7,453,343 B2 * | 11/2008 | Ito | H01F 41/046 | 336/200 |
| 7,471,180 B2 * | 12/2008 | Seong | H01F 27/2847 | 336/200 |
| 7,733,205 B2 * | 6/2010 | Hyvonen | H01L 23/5227 | 336/84 C |
| 7,843,303 B2 * | 11/2010 | Lu | H01F 17/0013 | 336/200 |
| 7,859,382 B2 * | 12/2010 | Koprivnak | H01F 30/04 | 336/200 |
| 8,044,861 B2 | 10/2011 | Pedersen | | |
| 8,079,134 B2 * | 12/2011 | Maki | H01F 17/06 | 427/116 |
| 8,274,352 B2 * | 9/2012 | Wei | H01F 17/0013 | 336/178 |
| 8,334,747 B2 * | 12/2012 | Matsumoto | H05K 1/165 | 336/200 |
| 8,502,632 B2 * | 8/2013 | Suganuma | H02M 3/155 | 336/200 |
| 8,749,338 B2 * | 6/2014 | Takahashi | H01F 27/2804 | 336/200 |
| 9,009,951 B2 * | 4/2015 | Chang | H01F 27/292 | 336/200 |
| 9,218,903 B2 * | 12/2015 | Sun | H01L 23/645 | |
| 9,251,948 B2 * | 2/2016 | Barry | H01F 19/04 | |
| 9,449,746 B2 * | 9/2016 | Johnston | H01F 27/2804 | |
| 9,704,644 B2 * | 7/2017 | Wang | H05K 1/0283 | |
| 9,831,026 B2 | 11/2017 | Barry | | |
| 10,398,025 B2 | 8/2019 | Takken | | |
| 10,587,060 B2 | 3/2020 | Takken | | |
| 11,056,268 B2 * | 7/2021 | Suzuki | H01F 27/2804 | |
| 11,189,416 B2 * | 11/2021 | Nakatsuji | H01F 27/323 | |
| 11,367,557 B2 * | 6/2022 | Zhang | H01F 27/24 | |
| 11,574,766 B2 * | 2/2023 | Liang | H02M 3/33592 | |
| 2003/0001713 A1 * | 1/2003 | Gardner | H01L 23/552 | 336/200 |
| 2003/0127686 A1 * | 7/2003 | Lowther | H01F 17/0013 | 257/E21.022 |
| 2004/0257190 A1 | 12/2004 | Peck | | |
| 2005/0196898 A1 | 9/2005 | Ho | | |
| 2010/0289610 A1 | 11/2010 | Jacobson | | |
| 2012/0320532 A1 * | 12/2012 | Wang | H05K 1/189 | 29/829 |
| 2013/0152379 A1 * | 6/2013 | Lee | G11B 5/3163 | 29/602.1 |
| 2013/0186679 A1 * | 7/2013 | Lee | H05K 3/4038 | 174/262 |
| 2016/0035478 A1 | 2/2016 | Furui | | |
| 2021/0327634 A1 * | 10/2021 | Liang | H01F 29/025 | |

OTHER PUBLICATIONS

Anonymous, "Introduction to Planar Magnetic PCB Design, Planar Magnetics an alternative to conventional core shapes" downloaded Dec. 2021 from https://www.terratel.eu/introduction-to-planar-magnetic-pcb-design.html, pp. 1-8.

Anonymous, "M2Spice: Advanced Tools for Planar Magnetics Modeling", Princeton Power Electronics Research Lab, Nov. 2021, downloaded from https://www.princeton.edu/~minjie/m2spice.html, pp. 1-3.

Marcel Dekker, "Transformer and Inductor Design Handbook" Chapter 20, Planar Transformers, Jan. 2004, pp. 1-19.

Taiwan Republic of China National Intellectual Property Administration Application, Notice of Allowance in Related Taiwanese Application 112103395 Mar. 26, 2024. pp. 8.

Authorized Officer Zimmer, Rene, European Patent Office, Counterpart PCT Appln. PCT/EP2023/054905. ISR & WO, Jun. 12, 2023. pp. 13.

* cited by examiner

SIDEWALL PLATING OF CIRCUIT BOARDS FOR LAYER TRANSITION CONNECTIONS

STATEMENT REGARDING FEDERALLY SPONSORED RESEARCH OR DEVELOPMENT

This invention was made with Government support under Contract No.: H98230-19-C-0113 awarded by Maryland Procurement Office. The Government has certain rights in this invention.

BACKGROUND

The present disclosure relates generally to a circuit board based device, and more particularly to sidewall plating of circuit boards for layer transition connections.

Printed circuit boards (PCBs) are structures having a rigid, non-conductive substrate layer or a laminate of multiple substrate layers and conductive pathways for routing electric/electronic signals and electric power to a circuit assembly that is typically mounted on the PCB surface. The conductive pathways may constitute a circuit assembly, including various electrical and electronic components and one or more devices. The conductive pathways may be located along the surface of the substrate or may be embedded on layers within a multi-layer substrate. Multiple printed circuit boards may be bonded together, and the conductive pathways may be electrically connected using through-hole vias in the printed circuit boards.

BRIEF SUMMARY

According to embodiments of the present invention, a circuit board includes: a first board material layer having a first planar surface and a first sidewall surface perpendicular to the first planar surface; a first conductive layer on the first planar surface; a second board material layer stacked on the first board material layer and having a second planar surface and a second sidewall surface perpendicular to the second planar surface; a second conductive layer on the second planar surface; and a plating on the first sidewall surface and the second sidewall surface and electrically connecting the first conductive layer and the second conductive layer.

According to embodiments of the present invention, an inductive structure includes: a magnetic core; a stack of a plurality of board material layers, each of the plurality of board material layers including a first planar surface and a second planar surface connected by a sidewall surface; a winding layer formed on at least one of the first planar surface and the second planar surface of each of at least two of the plurality of board material layers, wherein each of the winding layers is formed around the magnetic core; and a patterned sidewall plating on a sidewall of the stack formed of the sidewall surfaces of the plurality of board material layers, wherein the patterned sidewall plating electrically connects the winding layers of the at least two of the plurality of board material layers.

According to embodiments of the present invention, a method comprising: providing a circuit board comprising a plurality of board material layers, each of the plurality of board material layers including a first planar surface and a second planar surface connected by a sidewall surface, wherein a conductive layer is formed on at least one of the first planar surface and the second planar surface of each of at least two of the plurality of board material layers; and plating, with a conductive material, a sidewall of the circuit board formed of the sidewall surfaces of the plurality of board material layers and electrically connecting at least two of the conductive layers.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

- a planar inductive structure that includes at least one sidewall plating connection, which is a non-blocking interlevel connection (e.g., replacing a layer transition via, which may block a portion of a winding routing path on one or more layers);
- a planar inductive structure with an increased magnetic core cross sectional area that is not blocked by a layer transition via;
- a planar inductive structure without a layer transition via in a winding routing path;
- a planar inductive structure with a low winding resistance that result from a winding routing path that is not blocked by a layer transition via.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Planar magnetic devices, such as inductors and transducers, typically include a single printed circuit board bearing windings that circle one or more times around a ferrite core. According to some embodiments, conductive elements (e.g., a winding) disposed on printed circuit board material layers are electrically connected by sidewall plating providing layer transition connections, which do not block the routing of the conductive elements in a planar structure. Planar magnetic structures such as inductors and transformers are typically made with low cost circuit board technology, which uses drilled through-hole vias to make layer transitions between winding routing layers. When a through-hole via is used for a layer transition on a first circuit board material layer, windings on other circuit board material layers or circuit boards must be routed to avoid a connection to the through-hole via to which they do not terminate. The through-hole via does not use space optimally, leading to longer and/or more resistive windings, and/or lower core areas.

According to some embodiments of the present invention, a circuit board includes conductive material on sidewalls (inside sidewalls of a slot in the circuit board or outside sidewalls of the circuit board), which may replace layer transition vias. According to some aspects, since the sidewall plating does not block the path of transformer or inductor windings, similar to conventional layer transition vias, packaging can be improved, core areas can be made and/or lower resistance can be realized.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the overall fabrication method and the structures formed thereby are novel, certain individual processing steps required to implement the method may utilize conventional fabrication techniques and conventional fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such circuit devices may not be explicitly shown in a given figure for ease of explanation. This does not imply that the layer(s) not explicitly shown are omitted in the actual integrated circuit device.

Figure 1:
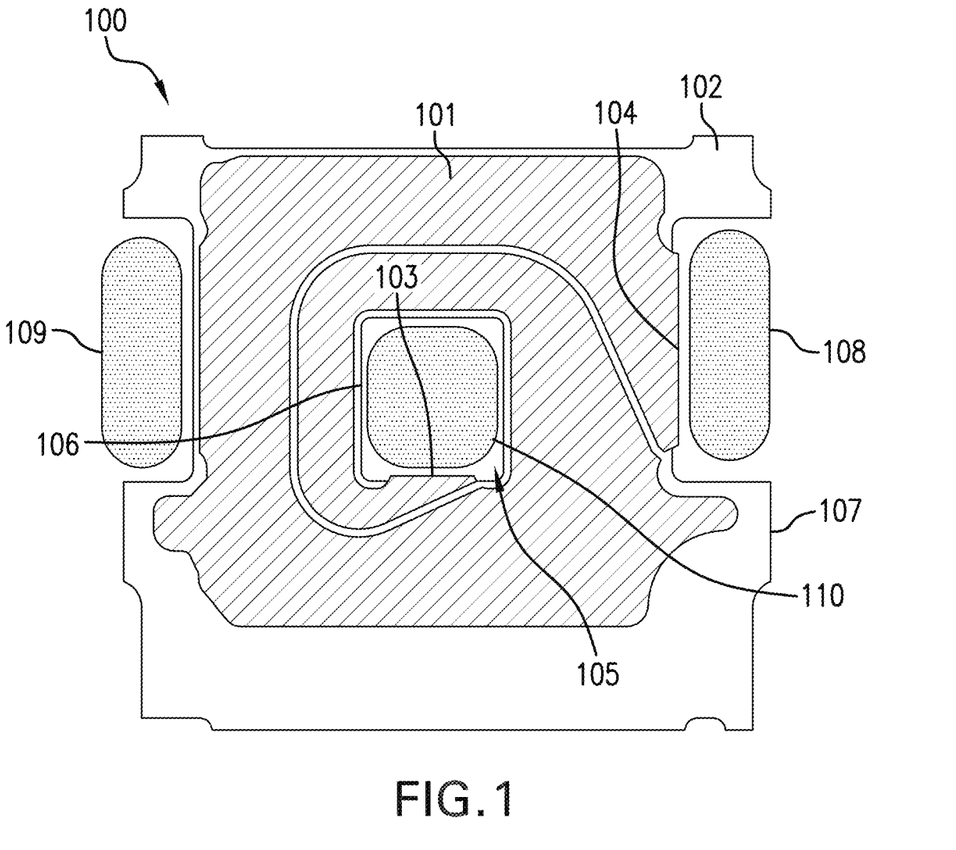
FIG. 1 is a planar view of a planar winding layer on a circuit board material layer and a magnetic core according to some embodiments of the present invention.

According to some embodiments and referring to FIG. 1, an inductive structure 100 includes a planar winding layer 101 on a circuit board 102. The circuit board 102 includes a slot 105 in a middle portion of the board, such that there is an inside sidewall 106 formed by the slot and an outside sidewall 107 around the board. According to some aspects, one or more other planar winding layers (not shown) can be electrically connected to the planar winding layer 101 by patterned plating on the inside sidewalls and/or the outside sidewalls of the circuit board. According to at least one embodiment, the patterned plating forms one or more sidewall connections.

It should be understood that the inside sidewalls and the outside sidewalls of the circuit board are substantially (i.e., within conventional tolerances of circuit boards) perpendicular to surfaces bearing the planar winding layer(s). Further, is should be understood that a slot is not analogous to a via at least because a via is created to enable a layer transition and does not have another function. A slot, according to some embodiments of the present invention, enables a magnetic core (e.g., a ferrite core, powder core, steel laminates) to pass through a circuit board. The magnetic core may function to concentrate magnetic flux. A slot, according to some embodiments of the present invention, has patterned plating on its sidewall(s). According to at least one embodiment, a slot is entirely internal to an area of a winding loop.

According to some embodiments, the planar winding layer is a conductive material (e.g., copper, copper alloy, graphite, tungsten, etc.). According to some embodiments, the conductive material (e.g., copper) of the planar winding layer has a thickness between about 0.6 millimeters (mm) and 5 mm, and more particularly between about 0.6 mm and 2.5 mm. According to some embodiments, the patterned plating is formed of a same, or electrically compatible, conductive material as the planar winding layer. According to some embodiments, the conductive material (e.g., copper) of the plating is deposited (e.g., by electro-plating) having a thickness between about 0.5 mm and 2 mm.

It should be understood that the thicknesses described herein are for illustrative purposes and are not limiting. For example, one of ordinary skill in the art would understand that different material thicknesses can be selected, e.g., based on deposition technologies, desired device performance, material characteristics, etc.

According to at least one embodiment, the patterned plating (on the sidewalls) can form an inside sidewall connection 103 on the inside sidewall 106 and an outside sidewall connection 104 on the outside sidewall 107 of circuit board. The inside sidewall connection 103 and the outside sidewall connection 104 may be used to make conductive connections to additional planar winding layers (e.g., patterned copper layers) on other circuit board material layers (e.g., cores) of the circuit board 102.

According to some embodiments, the inductive structure 100 further includes a magnetic core including three legs (first leg 108, second leg 109, third leg 110). It should be understood that a different number of legs can be used without departing from the scope of the disclosure. According to some embodiments, at least one leg of the magnetic core passes through a slot (e.g., slot 105) in the circuit board 102.

A circuit board is typically a laminated structure including a plurality of layers disposed as a stack and bonded together. According to at least one embodiment, these layers may include alternating cores and fills, and copper foil layers on outermost fills. The cores may be, for example, FR4 cores, which include fiberglass-reinforced (FR) epoxy-laminated sheets. The fills may be pre-preg material layers, for example, fiberglass cloth impregnated with a resin. The fills can be used to bond cores together and may function as a dielectric between cores or between cores and the copper foil layer on the outermost fills. According to some embodiments, the copper foil layers may be patterned or etched to form a planar winding. According to some aspects, each core comprises two patterned copper layers separated by a dielectric sheet (i.e., a dual-plated dielectric layer). According to at least one embodiment, heat and pressure can be applied to the stack, which may activate/melt the resin of the layers (e.g., of the fills) so that the layers (i.e., cores and fills) are bonded together into the circuit board.

According to one embodiment, an inductive structure includes 14 patterned copper layers on 7 cores.

Figure 2:
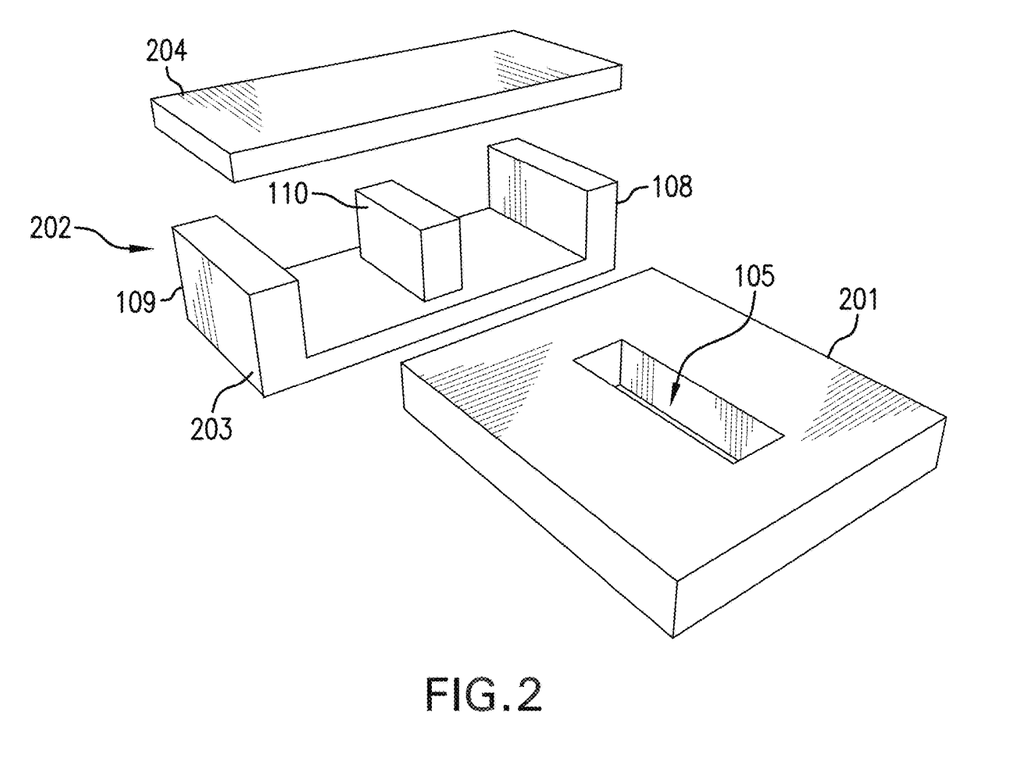
FIG. 2 is a disassembled view of a planar inductor device including a printed circuit board and a magnetic core according to some embodiments of the present invention.

According to some embodiments and referring to FIG. 2, a circuit board 201 may be disposed coincident with a magnetic core 202, with the third leg 110 of the magnetic core 202 disposed through the slot 105 of the circuit board 102. According to some embodiments, the magnetic core includes a bottom portion 203 and a top portion 204, which when connected (e.g., bonded together), and with the circuit board 102 disposed coincident with the magnetic core 202, forms an inductive structure including a winding loop (not shown in FIG. 2) and the magnetic core 202. According to some aspects, a circuit board 201 comprising a plurality of circuit board material layers (e.g., core, fill, etc.) bonded together in a stack is disposed coincident with the magnetic core 202 (such that the magnetic core may function to concentrate magnetic flux), wherein a winding (not shown) of the circuit board 201 and the magnetic core 202 form the inductive structure.

FIGS. 3-8 show six planar winding layers of a stackup of a circuit board according to one or more embodiments of the present invention. According at least one embodiment, each of the planar winding layers may be a pre-preg material layer or a core with one or two pre-preg material layers disposed on opposite sides of the core. More generally, a planar winding layer is a patterned copper layer.

FIGS. 3-8 show a 12-turn primary winding of a circuit board stackup according to some embodiments. According to some embodiments, the circuit board stackup includes a first core 300, a second core 400, etc., and a copper layer disposed on each of the cores, including first copper layer 301, second copper layer 401, third copper layer 501, fourth copper layer 601, fifth copper layer 701, and sixth copper layer 801. According to some embodiments, each copper layer may be patterned as a winding loop with one or more turns. It should be understood that primary side winding layers are shown on first sides of the respective cores and that, according to some aspects, secondary winding layers can be on opposite sides on the cores.

According to some embodiments, the cores may be bonded into a stack including a winding originating at first copper layer 301 at a first point 302, which may be a first end point of a multilayer winding, external to an area of the winding loops (e.g., not within an area of the winding configured for coupled inductance), and makes a first layer transition to second copper layer 401 via a sidewall plating 303 on an inside sidewall of a slot that is entirely internal to a planar area of the winding loops. A second layer transition from second copper layer 401 to third copper layer 501 is made via a sidewall plating 402 on an outside sidewall of the circuit board that is external to the planar area of the winding loops. A series of layer transitions are made that alternate between inside (303)(502)(702) or outside (402)(602) sidewalls of the circuit board stackup (including cores and fills), before the winding terminates on sixth copper layer 801 at a second point 802, which may be a second end point of the multilayer winding, external to the area of the winding loops. According to some aspects, the winding loops form a spiral from the first point 302 and extending to the second point 802.

According to some embodiments, each conductive element (e.g., a winding loop) to be connected by sidewall plating extends to an edge of the respective core. According to one embodiment, a core may have a first winding layer and a second winding layer disposed on opposite surfaces, and the first winding layer and the second winding layer may be connected by edge plating. According to some aspects, primary side windings layers are electrically connected together by first edge plating connections, and secondary side windings layers are electrically connected together by second edge plating connections (separate from—not electrically connected to—the primary side winding layers).

Figure 3:
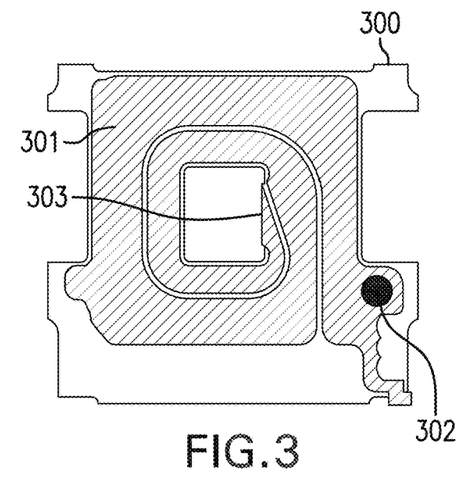
FIGS. 3-8 are planar views of a respective layers of an inductive structure according to some embodiments of the present invention.
Figure 4:
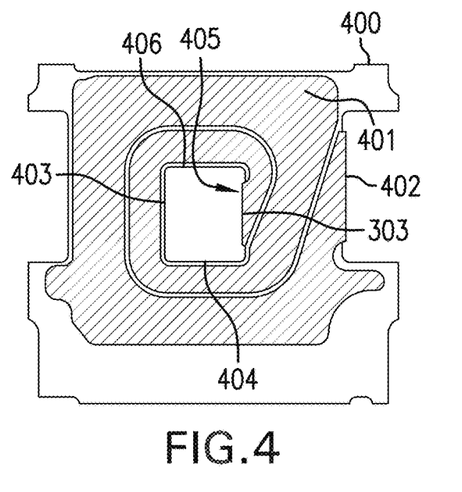
Figure 5:
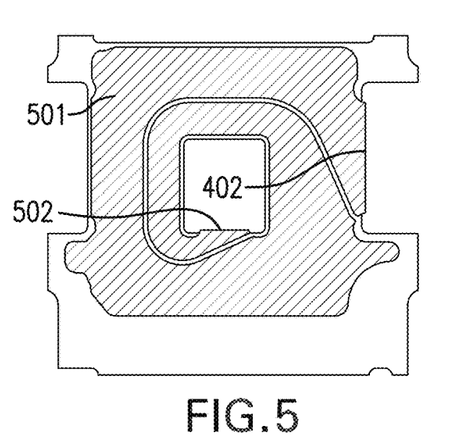
Figure 6:
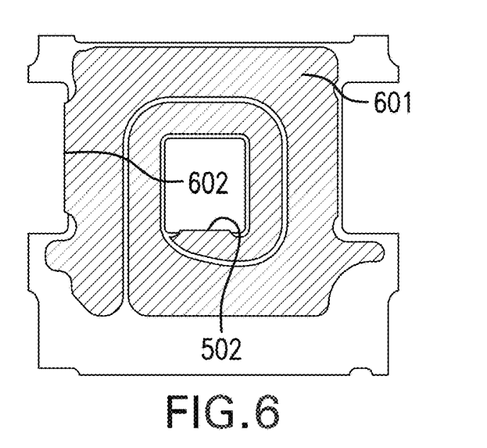
Figure 7:
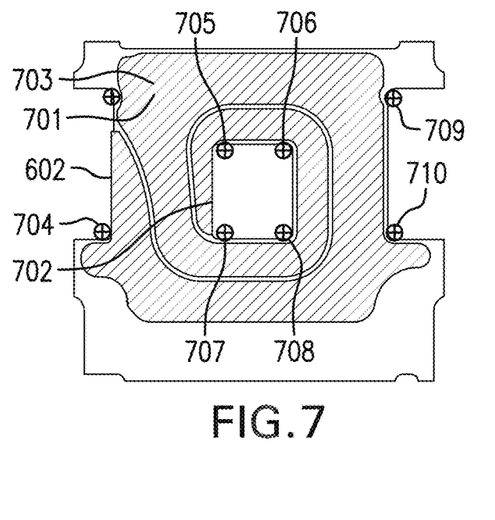
Figure 8:
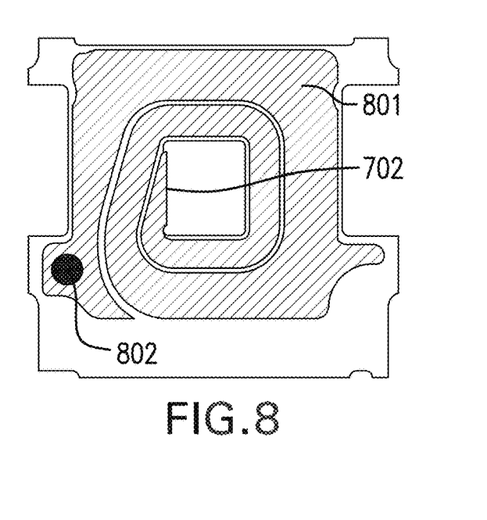

According to some embodiments, the stackup may include primary winding layers and second planar winding layers stacked in some arrangement, e.g., alternately. According to some embodiments, portions of the sidewall of the stackup can be reserved for the primary winding, the secondary winding, and/or other structures (e.g., control lines, grounding, connections, etc.). For example, as shown in FIGS. 3-8 different portions of a sidewall can be reserved for certain sidewall connections/layer transitions. In particular, FIG. 4 illustrates a first side 403, a second side 404, and a third side 405 of the inside sidewall formed by the slot 105 (see FIG. 1), which may be used by the primary winding. According to FIG. 4, edge plating on the third side 405 and the outside sidewall (i.e., sidewall plating 402) connects to the second copper layer 401. A different portion, e.g., a fourth side 406, of the inside sidewall of the slot 105 may be reserved for a secondary winding (e.g., where the inductive structure is a transformer), a control line, a grounding, etc. It should be understood that the slot is formed in each layer (e.g., core and fill) of the circuit board stackup, forming the first through fourth sides.

According to at least one example embodiment, two primary copper layers on opposite surfaces of a core are not electrically connected by edge plating. According to some embodiments, primary windings from a copper layer of a first core are electrically connected by edge plating to a copper layer on a different core, without electrically connecting adjacent copper layers (e.g., copper layers on opposite sides of the same core) together. According to at least one embodiments, two secondary copper layers located on adjacent layers are electrically connected by edge plating (e.g., in a case where all secondary layers are electrically connected in parallel, and an electrical connection is made between certain adjacent secondary layers (i.e., middle secondary layers).

According to some embodiments, the sidewalls of the circuit board may be electro-plated with a conductive material (e.g., copper), and patterned (e.g., using a router tool) to remove portions of the sidewall plating that may otherwise short different portions of the winding, physically connect the winding and a secondary winding, etc. For example, referring to FIG. 7, a router can be used to remove vertical (to the stackup) portions sidewall plating at, for example, locations 703-710. It should be understood that a router tool applied to the circuit board may remove a portion of the sidewall plating from a top of the circuit board to a bottom of the circuit board (i.e., from sidewalls of all layers of the stackup), where a remaining portion of the conductive material is at least one electrical connection connecting the at least two of the conductive layers.

According to some embodiments, winding layers may be connected in series or in parallel. For example, as illustrated in FIGS. 3-8, the layers (copper layers 301-801) are connected in series. According to at least one embodiments, a secondary winding (not shown) may be formed of a plurality additional layers disposed between ones of the copper layers 301-801, which may be connected in parallel (e.g., in the case of single turn windings).

Figure 9:
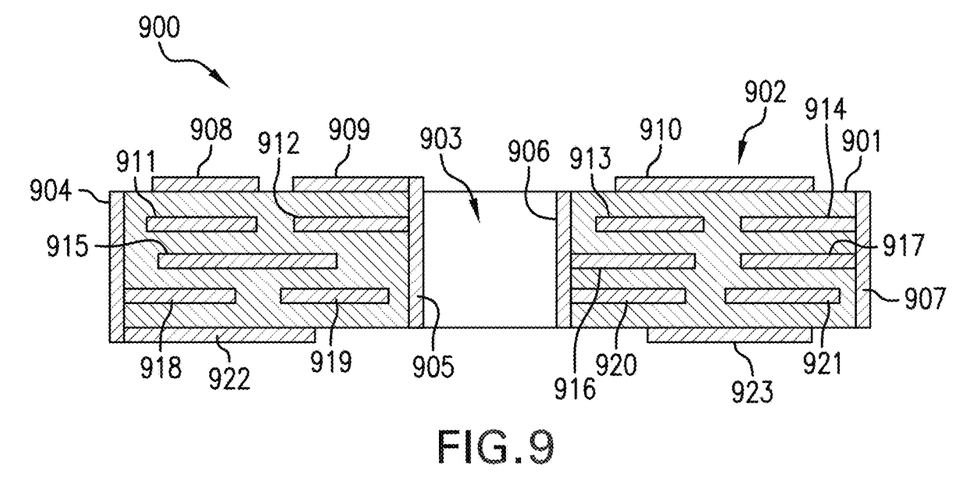
FIG. 9 is a cross-section view of an inductive structure according to some embodiments of the present invention.

According to some embodiments and referring to FIG. 9, an inductive structure 900 (magnetic core not shown) comprises a stack 901 including a plurality of circuit board material layers including a wiring 902 formed of a conductive material disposed on planar surfaces and sidewall surfaces of the circuit board material layers. The stack 901 includes a slot 903 in a middle portion of the circuit board material layers (i.e., cores and fills). The slot 903 may be formed by a router following the bonding of the circuit board material layers. The wiring 902 includes a plurality of winding layer transitions 904-907 disposed on sidewalls of the stackup 901 and a plurality of planar copper portions 908-923 disposed on cores of the circuit board material layers. The plurality of connecting portions 904-907 and the plurality of planar winding layers 908-923 form the wiring wrapped around a magnetic core (not shown) disposed in the slot 903.

Figure 10:
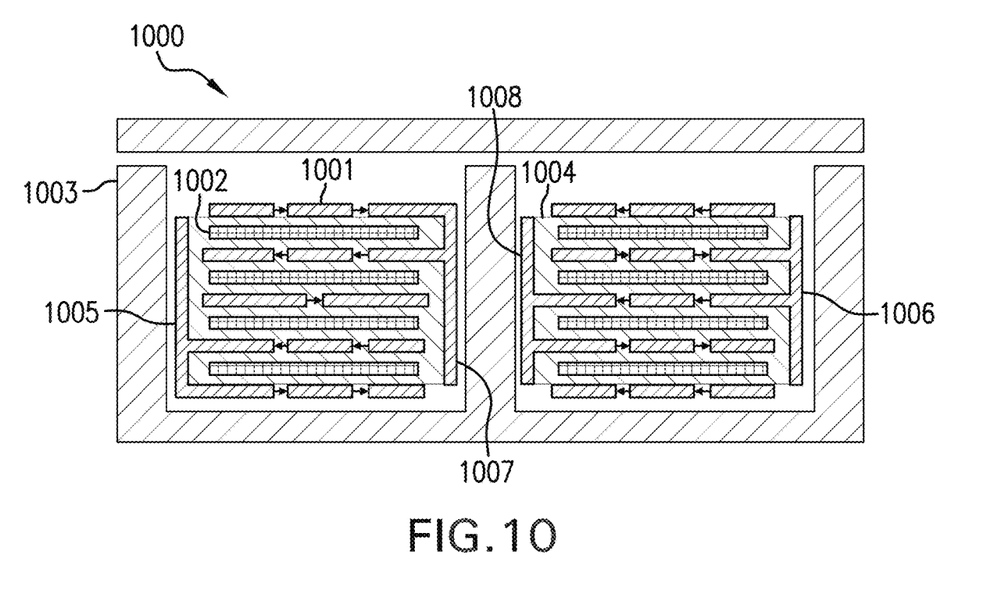
FIG. 10 is a cross-section view of a transformer according to some embodiments of the present invention.

According to some embodiments and referring to FIG. 10, the inductive structure is a transformer 1000 including a primary winding 1001 and a secondary winding 1002 disposed coincident with a magnetic core 1003. According to some embodiments, the primary winding and the secondary winding are disposed on a plurality of circuit board material layers 1004 (e.g., cores). According to some aspects, a patterned sidewall plating electrically connects the winding layers of different ones of the circuit board material layers. For example, first and second outside patterned sidewall plating 1005-1006 and first and second inside patterned sidewall plating 1007-1008 connects winding layers of the primary winding 1001. According to some embodiments, a different patterned sidewall plating (not shown) connects winding layers of the secondary winding.

According to some embodiments, a stack of circuit board material layers does not include conventional layer transition vias that may block winding routing paths. A sidewall plating connection according to some aspects of the present invention does not use surface area of a circuit board material layer, and does not disrupt winding routing paths on other circuit board material layers, for example, where a via-based connection on a first layer requires a hole to be drilled through at least a second layer where the via does not terminate. For example, in the case of a layer transition via, the via will pass through one or more of the boards in the stack and an area occupied by the layer transition via cannot be used for the winding routing, either on a board material layer where the via is used for a connection or any other board material layer where the via passes through. Such conventional layer transition vias may reduce an area available for the winding and increase a resistance through the winding (i.e., due to narrowed windings passing around a via).

Figure 11:
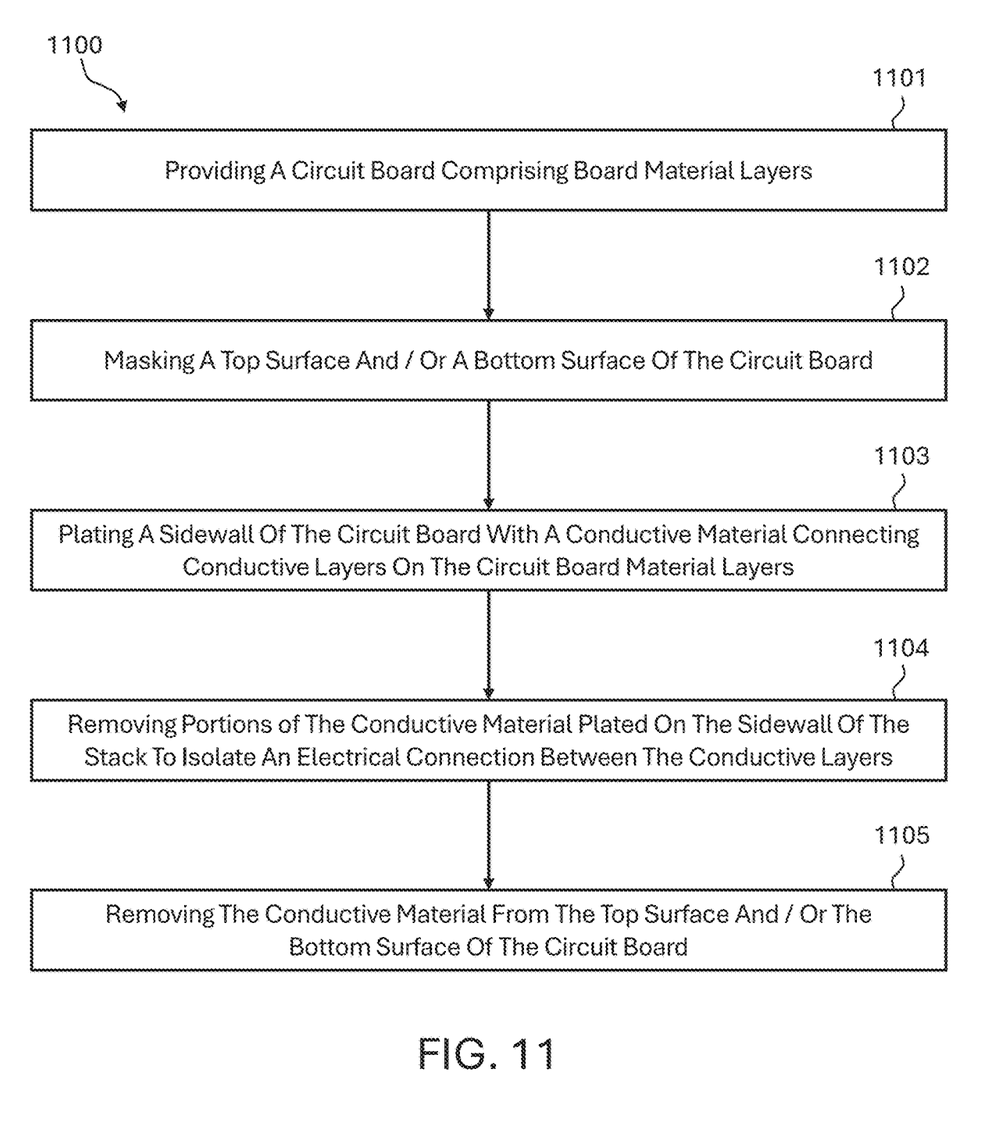
FIG. 11 is a method of manufacturing an inductive structure according to some embodiments of the present invention.

According to some embodiments and referring to FIG. 11, a method (1100) of manufacturing a device includes providing a circuit board (at step 1101) comprising a plurality of circuit board material layers, each of the circuit board material layers including a first planar surface and a second planar surface connected by a sidewall surface, wherein a conductive layer such as a winding layer is formed on one or more planar surfaces of at least two of the plurality of circuit board material layers. According to at least one embodiment, the top surface and/or the bottom surface of the circuit board may be masked (at step 1102). According to some aspects, the method further comprises plating (at step 1103) the sidewall surfaces of the circuit board with a conductive material, wherein the sidewall surfaces of the circuit board are formed of the sidewall surfaces of the plurality of circuit board material layers. According to at least one embodiment, the method further includes removing portions of the conductive material (at step 1104) from the sidewall surfaces of the circuit board to isolate an electrical connection connecting the conductive layers (e.g., forming a multilayer winding comprising the winding layers) of the at least two of the plurality of board material layers. According to some aspect, any conductive material plated on a mask on the top surface and/or the bottom surface of the circuit board may be removed (at step 1105).

According to at least one embodiment, the removal of the conductive material (at step 1104) is performed using a router tool, photoetching, and/or other patterning techniques.

According to some embodiments, the circuit board (e.g., stackup 901) can include a material, such as a liquid photo-imageable material, disposed on a top surface and/or a bottom surface of the stack (e.g., on a patterned copper foil), for example, to prevent the plating from electrically contacting (e.g., shorting) the patterned copper foil on the planar surfaces. For example, according to some embodiments, the complete circuit board is electro-plated, wherein the top surface and/or the bottom surface are protected from the plating, while the plating is disposed on the sidewall surfaces.

According to some aspects, the top surface and/or the bottom surface of the circuit board may be covered with a photoresist, masking the patterned copper foil. According to at least one example embodiment, in a case where a photoresist is used, a layer of tin may be plated onto the copper edge plating, which can protect the copper edge plating while the photoresist and any non-circuitry metal may be subsequently removed.

According to some aspects, exemplary embodiments described herein with respect to forming layer transitions on sidewalls of a given circuit board are extendable to forming layer transitions on sidewalls of a macro-stack of a plurality of circuit boards bonded together. For example, a layer transition formed by a sidewall plating can be used for transitions between different circuit boards. Thus, according to some embodiments, references to circuit board layers include circuit boards unless explicitly differentiated.

Recapitulation:

According to embodiments of the present invention, a circuit board includes: a first board material layer (first core 300) having a first planar surface and a first sidewall surface perpendicular to the first planar surface; a first conductive layer (e.g., first copper layer 301) on the first planar surface;

a second board material layer (second core 400) stacked on the first board material layer and having a second planar surface and a second sidewall surface perpendicular to the second planar surface; a second conductive layer (e.g., second copper layer 401) on the second planar surface; and a plating (e.g., connecting portion 907) on the first sidewall surface and the second sidewall surface and electrically connecting the first conductive layer and the second conductive layer.

According to embodiments of the present invention, an inductive structure includes: a magnetic core (magnetic core 202); a stack (901) of a plurality of board material layers, each of the plurality of board material layers including a first planar surface and a second planar surface connected by a sidewall surface; a winding layer (wiring 902) formed on at least one of the first planar surface and the second planar surface of each of at least two of the plurality of board material layers, wherein each of the winding layers is formed around the magnetic core; and a patterned sidewall plating (904) on a sidewall of the stack formed of the sidewall surfaces of the plurality of board material layers, wherein the patterned sidewall plating electrically connects the winding layers of the at least two of the plurality of board material layers.

According to embodiments of the present invention, a method (1100) comprises: providing a circuit board (at step 1101) comprising a plurality of board material layers, each of the plurality of board material layers including a first planar surface and a second planar surface connected by a sidewall surface, wherein a conductive layer is formed on at least one of the first planar surface and the second planar surface of each of at least two of the plurality of board material layers; and plating (at step 1103), with a conductive material, a sidewall of the circuit board formed of the sidewall surfaces of the plurality of board material layers and electrically connecting at least two of the conductive layers. According to embodiments of the present invention, the method includes removing portions of the conductive material from the sidewall of the circuit board (at step 1104) to isolate an electrical connection connecting the at least two of the conductive layers.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit board comprising:
   an outer sidewall on a periphery of the circuit board, the outer sidewall having an outer sidewall surface having a first conductive plating;
   a slot extending through the circuit board, the slot including an inner sidewall surface having a second conductive plating;
   a plurality of stacked board material layers, wherein each of the board material layers of the plurality of stacked board material layers includes:
      a planar surface perpendicular to both the outer sidewall surface and the inner sidewall surface; and
      a conductive layer on the planar surface; and
   an electrical connection between the conductive layers of the plurality of stacked board material layers, the electrical connection between the conductive layers alternating between a connection to the first conductive plating of the outer sidewall surface and a connection to the second conductive plating of the inner sidewall surface.

2. The circuit board of claim 1, wherein each conductive layer, of the plurality of stacked board material layers, comprises windings that circle around the slot, wherein windings of a first board material layer of the plurality of stacked board material layers and windings of a second board material layer of the plurality of stacked board material layers are electrically connected by one of the first conductive plating or the second conductive plating.

3. The circuit board of claim 1, further comprising a dielectric layer between each of the board material layers of the plurality of stacked board material layers.

4. The circuit board of claim 1, wherein each conductive layer of the plurality of stacked board material layers, the first conductive plating, and the second conductive plating include copper.

5. The circuit board of claim 1, wherein the slot extends through a middle portion of the circuit board.

6. The circuit board of claim 5, further comprising a magnetic core extending through the slot.

7. The circuit board of claim 1, wherein a first conductive layer extends to a first edge of a first board material layer of the plurality of stacked board material layers and a second conductive layer extends to a second edge of a second board material layer of the plurality of stacked board material layers.

8. An inductive structure comprising:
   a magnetic core;
   a stack of a plurality of board material layers, each of the plurality of board material layers including a first planar surface and a second planar surface;
   a winding layer formed on at least one of the first planar surface and the second planar surface of the plurality of board material layers, wherein each of the winding layers is formed around the magnetic core;
   a first sidewall on a periphery of the stack, the first sidewall being perpendicular to the first planar surface and the second planar surface; and
   a first patterned sidewall plating on the first sidewall of the stack and a second patterned sidewall plating on a second sidewall of the stack, wherein an electrical connection of the winding layers of the plurality of board material layers, alternates between the first patterned sidewall plating and the second patterned sidewall plating.

9. The inductive structure of claim 8, wherein the stack of the plurality of board material layers includes a slot, and a portion of the magnetic core is disposed in the slot.

10. The inductive structure of claim 9, wherein the slot forms the second sidewall of the stack, and the second patterned sidewall plating is formed on the second sidewall of the stack.

11. The inductive structure of claim 8, wherein the winding layers, the first patterned sidewall plating, and the second patterned sidewall plating includes a copper material.

12. The inductive structure of claim 8, wherein the first patterned sidewall plating and the second patterned sidewall plating form a plurality of winding layer transitions between the plurality of board material layers.

13. The inductive structure of claim 8, wherein at least one of the winding layers comprises a first end point and a different one of the winding layers comprises a second end point, wherein the winding layers, electrically connected by the first patterned sidewall plating and the second patterned sidewall plating, form a spiral and the first end point and the second end point are at opposite ends of the spiral.

14. The inductive structure of claim 8, wherein the magnetic core is a ferrite core.

15. A method comprising:
providing a circuit board comprising a plurality of board material layers, each of the plurality of board material layers including a first planar surface and a second planar surface connected by a sidewall surface, wherein a conductive layer is formed on at least one of the first planar surface and the second planar surface of each of at least two of the plurality of board material layers;
plating, with a conductive material, a first sidewall of the circuit board formed of the sidewall surfaces of the plurality of board material layers and electrically connecting at least two of the conductive layers, the first sidewall being on a surface of a periphery of the circuit board; and
plating, with the conductive material, a second sidewall of the circuit board formed of the sidewall surfaces of the plurality of board material layers and electrically connecting at least two of the conductive layers,
wherein an electrical connection between the conductive layers of the plurality of board material layers alternates between the first sidewall of the circuit board and the second sidewall of the circuit board.

16. The method of claim 15, wherein the first sidewall of the circuit board is one of an outside sidewall and the second sidewall of the circuit board is one of an inside sidewall of a slot.

17. The method of claim 15, further comprising removing portions of the conductive material from the first sidewall of the circuit board where a remaining portion of the conductive material is at least one electrical connection connecting the at least two of the conductive layers.

18. The method of claim 17, wherein the removing portions of the conductive material comprises routing, using a router, along a vertical surface of the sidewall.

19. The method of claim 17, wherein the removing portions of the conductive material comprises etching the conductive material.

20. The method of claim 15, wherein each of the conductive layers are winding layers, and wherein plating forms a multilayer winding comprising the winding layers of the plurality of board material layers.

* * * * *